United States Patent
Shin et al.

(10) Patent No.: US 10,323,104 B2
(45) Date of Patent: Jun. 18, 2019

(54) DYE COMPLEX, PHOTOCONVERSION FILM AND ELECTRONIC ELEMENT INCLUDING SAME

(71) Applicant: LG CHEM, LTD., Seoul (KR)

(72) Inventors: Du Hyeon Shin, Daejeon (KR); Sehwan Son, Daejeon (KR); Jungho Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/321,114

(22) PCT Filed: Jul. 31, 2015

(86) PCT No.: PCT/KR2015/008038
§ 371 (c)(1),
(2) Date: Dec. 21, 2016

(87) PCT Pub. No.: WO2016/021883
PCT Pub. Date: Feb. 11, 2016

(65) Prior Publication Data
US 2017/0137540 A1    May 18, 2017

(30) Foreign Application Priority Data
Aug. 2, 2014 (KR) .................. 10-2014-0099358

(51) Int. Cl.
| | | |
|---|---|---|
| C08F 2/46 | (2006.01) | |
| C08F 2/50 | (2006.01) | |
| C08G 61/04 | (2006.01) | |
| C08B 37/16 | (2006.01) | |
| C08J 5/18 | (2006.01) | |
| C09B 69/10 | (2006.01) | |
| F21V 9/30 | (2018.01) | |
| C08L 29/04 | (2006.01) | |
| G02F 1/1335 | (2006.01) | |
| G02B 1/04 | (2006.01) | |
| H01L 31/0224 | (2006.01) | |
| H01L 27/32 | (2006.01) | |
| H01L 33/50 | (2010.01) | |
| H01L 51/00 | (2006.01) | |

(52) U.S. Cl.
CPC ...... C08B 37/0015 (2013.01); C08B 37/0012 (2013.01); C08J 5/18 (2013.01); C08L 29/04 (2013.01); C09B 69/10 (2013.01); C09B 69/103 (2013.01); C09B 69/109 (2013.01); F21V 9/30 (2018.02); G02B 1/04 (2013.01); G02F 1/133514 (2013.01); H01L 27/322 (2013.01); H01L 31/022425 (2013.01); H01L 33/502 (2013.01); H01L 51/005 (2013.01); H01L 51/0054 (2013.01); H01L 51/0073 (2013.01)

(58) Field of Classification Search
CPC ..... C08B 37/0015; F21V 9/16; C09B 69/103; C09B 69/10
USPC .................................. 522/1; 520/1
See application file for complete search history.

(56) References Cited

U.S. PATENT DOCUMENTS

| | | | | |
|---|---|---|---|---|
| 4,724,201 A | * | 2/1988 | Okazaki .......... | G03C 1/12 430/570 |
| 5,108,505 A | * | 4/1992 | Moffatt .......... | C09D 11/30 106/31.36 |
| 5,352,563 A | * | 10/1994 | Kawasaki .......... | G03C 1/04 430/264 |
| 5,766,832 A | * | 6/1998 | Nishio .......... | G03C 5/265 430/440 |
| 5,994,143 A | * | 11/1999 | Bieniarz .......... | C09B 69/10 436/106 |
| 8,968,845 B2 | | 3/2015 | Park et al. | |
| 2007/0212400 A1 | | 9/2007 | Kuwabara | |
| 2012/0190057 A1 | * | 7/2012 | Gvichiya .......... | G01N 33/57407 435/29 |
| 2012/0302881 A1 | | 11/2012 | Teranishi et al. | |
| 2014/0242286 A1 | * | 8/2014 | Allison .......... | C09D 11/16 427/429 |
| 2014/0315315 A1 | * | 10/2014 | Neves .......... | C07K 1/145 436/17 |
| 2015/0110772 A1 | | 4/2015 | Scherman et al. | |

FOREIGN PATENT DOCUMENTS

| | | |
|---|---|---|
| CN | 102770460 A | 11/2012 |
| GB | 2357180 A | 6/2001 |
| JP | 61-97025 A | 5/1986 |
| JP | 2003-315832 A | 11/2003 |
| JP | 2010-260951 | 11/2010 |
| KR | 10-2008-0103683 A | 11/2008 |
| KR | 10-2010-0058902 A | 6/2010 |
| KR | 10-2013-0069161 A | 6/2013 |
| WO | 2010/026957 A1 | 3/2010 |
| WO | 2013/124654 A1 | 8/2013 |

OTHER PUBLICATIONS

Park et al, Reduced Fluorescence Quenching of Cyclodextrin-acrtylene dye rotaxanes, 2006, J. Am. Chem. Soc., 123, 7714-7715 (Year: 2006).*

Huff et al, Synthesis and Reactivity of 6-beta-cyclodextrin monoaldehyde: an electrophilic cyclodextrin for the derivatization of macromolecules under mild conditions, Jun. 17, 1994, J. Org. Chem., 59, 7511-7516 (Year: 1994).*

"Reduced Fluorescence Quenching of Cyclodextrin-Acetylene Dye Rotaxanes"; Park, et al.; J. Am. Chem. Soc. 2006, 128, 7714-7715. J. Am.Chem.Soc. 2006, vol. 128, pp. 7714-7715.

Park: "Cyclodextrin-dye Rotaxanes", Polymer Science and Technology, vol. 23, No. 1, pp. 29-38 (2012). (With Machine Translation).

* cited by examiner

Primary Examiner — Jessica Whiteley
(74) Attorney, Agent, or Firm — Dentons US LLP

(57) ABSTRACT

The present specification relates to a dye complex, a light conversion film, and an electronic device including the same.

18 Claims, 5 Drawing Sheets

[Figure 1]
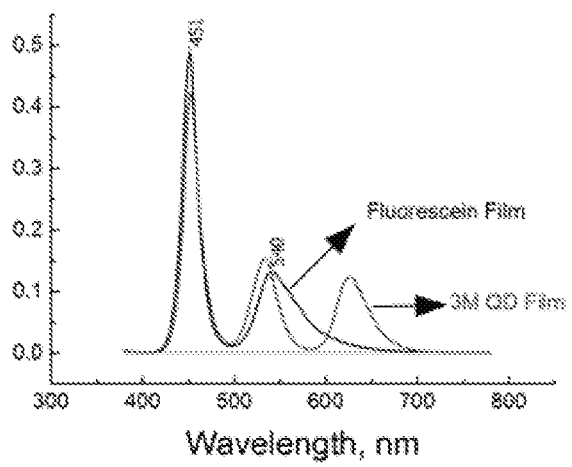
[Figure 2]
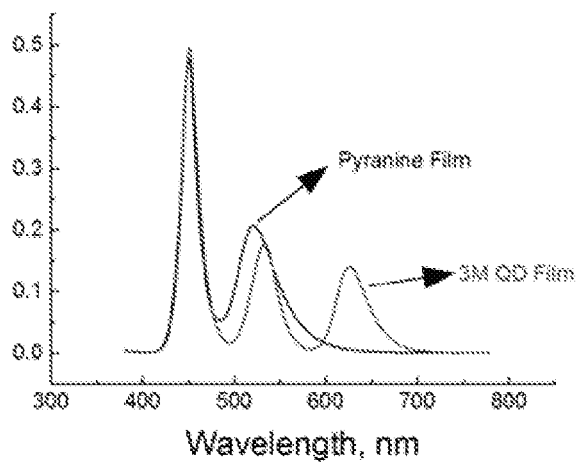

[Figure 3]
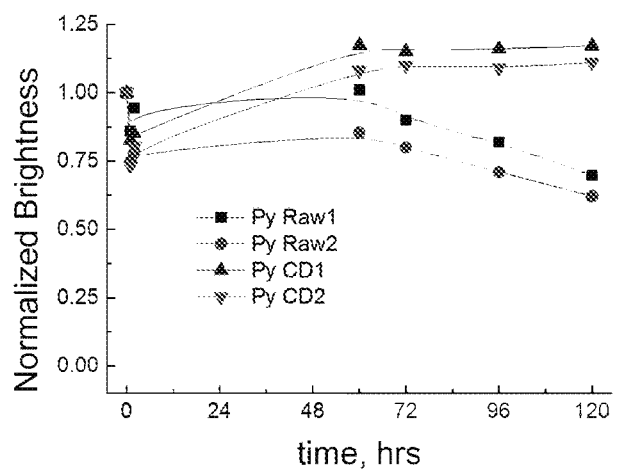
[Figure 4]
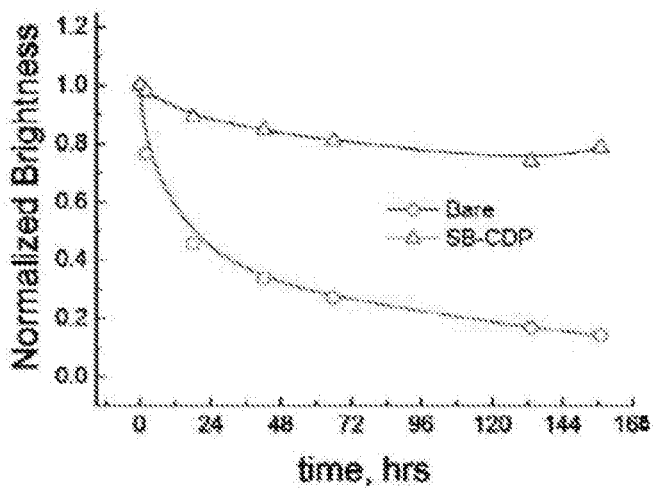

[Figure 5]
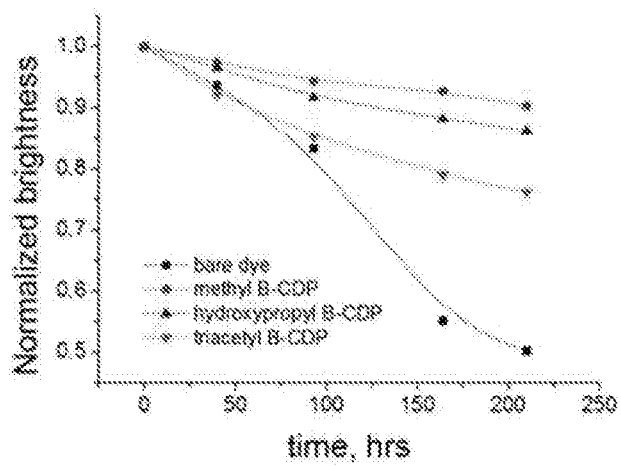
[Figure 6]
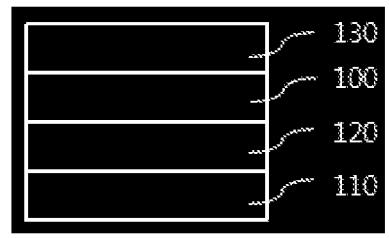
[Figure 7]
[Figure 8]
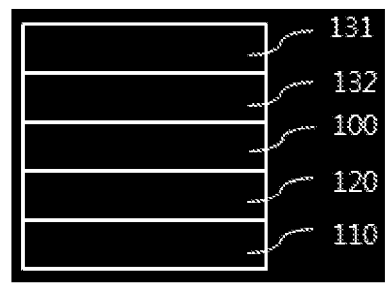

[Figure 9]
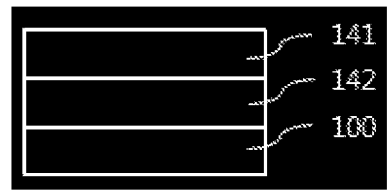
[Figure 10]
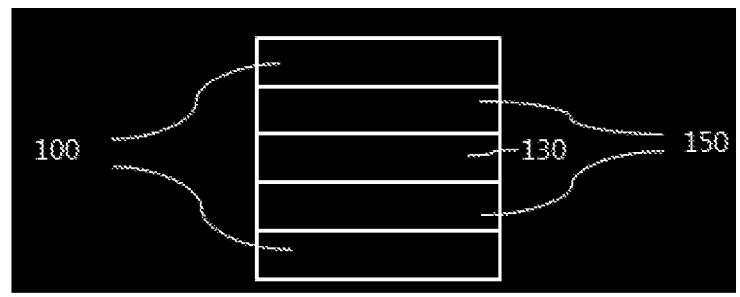
[Figure 11]
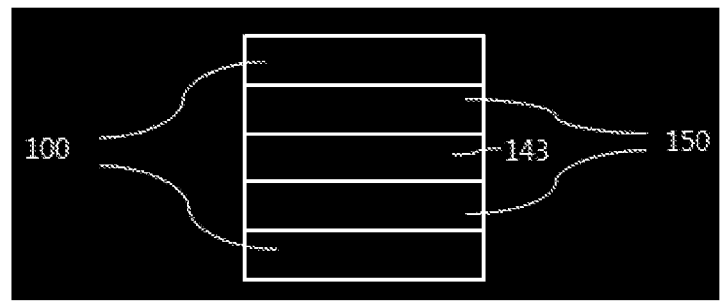
[Figure 12]
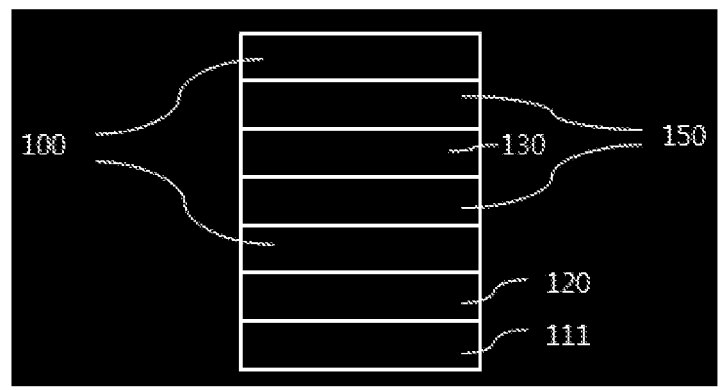

[Figure 13]
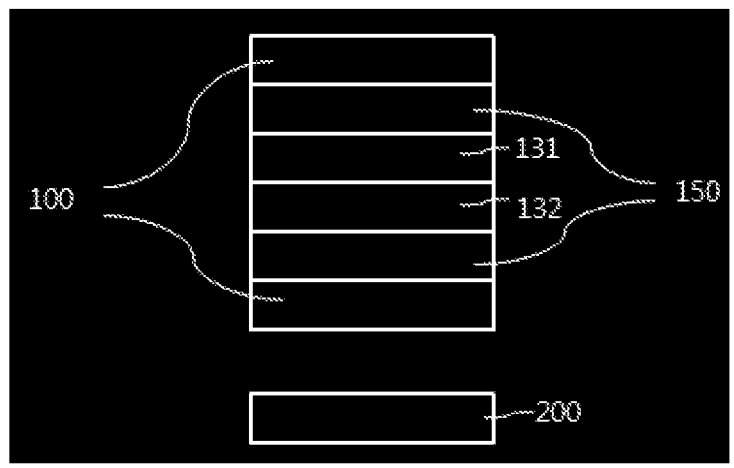
[Figure 14]
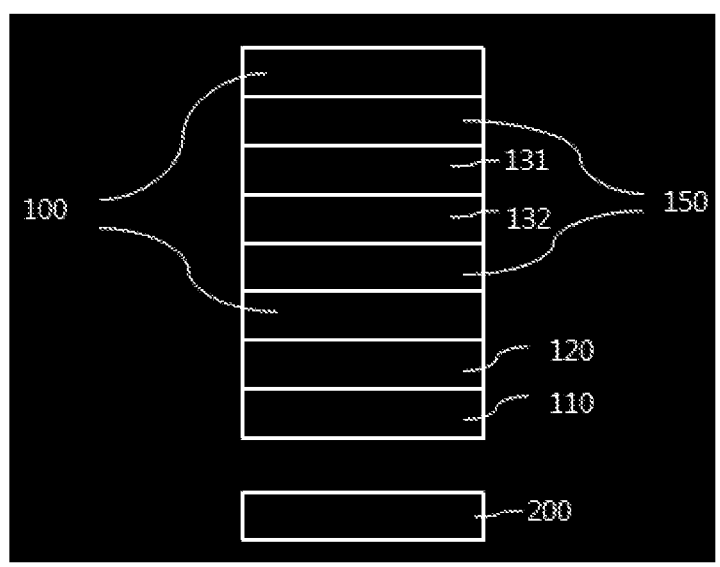

DYE COMPLEX, PHOTOCONVERSION FILM AND ELECTRONIC ELEMENT INCLUDING SAME

TECHNICAL FIELD

This application is a National Stage Entry of International Application No. PCT/KR2015/008038, filed Jul. 31, 2015, and claims the benefit of and priority to Korean Application No. 10-2014-0099358, filed on Aug. 2, 2014, all of which are hereby incorporated by reference in their entirety for all purposes as if fully set forth herein.

The present specification relates to a dye complex, a light conversion film, and an electronic device including the same.

BACKGROUND ART

The present invention relates to a light conversion device absorbing light in a region ranging from a near ultraviolet ray to a visible ray from a light source to perform conversion into a visible ray having a predetermined wavelength (color), and more particularly, to a light conversion film including an organic fluorescent dye and a light conversion device including the light conversion film.

Generally, a fluorescent material is a light emission material absorbing energy in a form such as light or electricity from the outside to emit light having an intrinsic wavelength, and may be classified into an inorganic fluorescent material, an organic fluorescent dye, a nano-crystal fluorescent material, and the like according to a component constituting the fluorescent material and a light emission mechanism. Recently, various efforts for modifying a spectrum of the light source by using the fluorescent materials have been made, due to the above efforts, a portion of a predetermined wavelength of light emitted from the light source is absorbed by the fluorescent material and is converted into light having a longer wavelength in a visible ray region to be emitted, and brightness, color purity, and color reproducibility of emitted light, and the like may be largely improved according to a light emission property of the fluorescent material.

Since the inorganic fluorescent material is constituted by a mother substance such as sulfides, oxides, and nitrides and an activator ion, has excellent physical and chemical stabilities, and may be reproduced with high color purity, the inorganic fluorescent material may be applied to a high-quality display apparatus, but there are drawbacks in that the fluorescent material is very expensive, light emission efficiency is low, and particularly, there is a limit in development of the fluorescent material excited in a near ultraviolet ray or blue region of 400 nm or more to emit light.

A fluorescent wavelength of the nano-crystal fluorescent material formed of Group II-IV or III-V semiconductor particles having a size of several nanometers is changed according to a particle size unlike the organic fluorescent dye. As the particle size is reduced, light having a short wavelength is emitted, and the nano-crystal fluorescent material may represent all visible ray regions having a desired wavelength by adjusting the size. Further, since a light absorption coefficient is 100 to 1000 times larger than that of a general organic dye and quantum efficiency is higher than that of the general organic dye, very strong fluorescence occurs, and particularly, only transition from a ground vibration state of a conduction band to a ground vibration state of a valence band is observed, and thus the fluorescent wavelength exhibits almost monochromatic light, but there are drawbacks in that it is difficult to secure price competitiveness due to a high raw material cost, and particularly, the fluorescent material is weak to heat, oxygen, or the like.

On the other hand, the organic fluorescent dye has merits in that as compared to the inorganic fluorescent material, various light emission spectra are present, quantum efficiency is excellent, and particularly, costs are low, and thus a value to be used as a light conversion device is sufficient. However, the concentration should be increased in order to increase conversion efficiency of light passing through the organic fluorescent dye and the intensity of converted light. In this case, it is known that an extinction phenomenon by the concentration cannot be avoided, and particularly, stability to heat or light is reduced, and thus it is necessary to maximize light emission efficiency and stably maintain a light emission property by using a more stable organic or inorganic material to protect the organic dye. As a method of stabilizing the organic dye, a method of improving light stability of the fluorescent dye in an aqueous solution by using cucurbiturils to form a cucurbituril-dye complex is proposed.

PRIOR ART DOCUMENT

[Patent Document]
U.S. Patent Publication No. 2008-0023646

DETAILED DESCRIPTION OF THE INVENTION

Technical Problem

The present specification has been made in an effort to provide a dye complex having improved durability and quantum efficiency, and a light conversion film, a color filter, and a display including the same.

Technical Solution

An exemplary embodiment of the present specification provides a dye complex including: a polymer including two or more cyclodextrin units; and a dye included in the cyclodextrin unit of the polymer. Herein, the cyclodextrin unit means a state in which cyclodextrin itself or a compound where one or more hydrogens thereof are substituted by other substituent groups is bonded with a divalent group in the polymer by a polymerization reaction.

Another exemplary embodiment of the present specification provides a light conversion film including: the dye complex or a cured material thereof.

Yet another exemplary embodiment of the present specification provides a light conversion film including: a polymer including two or more cyclodextrin units or a cured material thereof; and a dye.

Still another exemplary embodiment of the present specification provides a color filter including: the light conversion film.

Still yet another exemplary embodiment of the present specification provides an electronic device including: the light conversion film.

Advantageous Effects

According to the exemplary embodiments of the present specification, since a dye is included by an internal cavity of a cyclodextrin unit of a polymer having two or more cyclodextrin units, the dye is protected from an attack of a radical, and since the dye is included in the cyclodextrin units distributed at a predetermined interval in the polymer, an interval between the dyes can be adjusted, and thus it is possible to increase dispersion stability by dispersing the dyes at a desired interval. Thereby, it is possible to minimize a reduction in light emission efficiency due to agglomeration of the dye and stably maintain an intrinsic light emission property, and thus it is possible to provide a dye complex having improved thermal stability, quantum efficiency, and light emission efficiency.

According to the exemplary embodiments of the present specification, it is possible to provide a light emission device having thermal stability by using the aforementioned polymer.

According to the exemplary embodiments of the present specification, when the aforementioned polymer is used, it is possible to provide a light conversion film absorbing light in a region ranging from a near ultraviolet ray to a visible ray to perform conversion into a visible ray having a different wavelength (color). Thereby, it is possible to provide a light conversion film converting light emitted from an LED chip having a single color into light of a white LED having high color purity and color reproducibility.

BRIEF DESCRIPTION OF DRAWINGS

FIG. 1 illustrates a spectrum of a light conversion film manufactured by applying a fluorescein-beta (β) cyclodextrin polymer (macromolecule) complex.

FIG. 2 illustrates a spectrum of a light conversion film manufactured by applying a pyranine-gamma (γ) cyclodextrin polymer (macromolecule) complex.

FIG. 3 illustrates a test result of light resistance stability of a light conversion device manufactured in Example 3 and Comparative Example 1.

FIG. 4 illustrates a test result of light resistance stability of a light conversion device manufactured in Example 4 and Comparative Example 2.

FIG. 5 illustrates a test result of light resistance stability of a light conversion device manufactured in Example 5 and Comparative Example 3.

FIGS. 6 to 14 are lateral views illustrating a structure of a light conversion device according to an exemplary embodiment of the present invention.

EXPLANATION OF REFERENCE NUMERALS AND SYMBOLS

100: Transparent substrate
110: Light extraction film
111: Light extraction plate
120: Adhesive/attaching layer
130: Light conversion film
131: First light conversion film
132: Second light conversion film
140: Light conversion diffusion film
141: First light conversion diffusion film
142: Second light conversion diffusion film
143: Light conversion fluorescent diffusion film
150: Barrier layer
200: Light source

BEST MODE

Hereinafter, the present specification will be described in detail.

According to an exemplary embodiment of the present invention, there is provided a dye complex including a polymer including two or more cyclodextrin units, and a dye included in the cyclodextrin unit of the polymer.

The polymer is not particularly limited as long as the polymer includes two or more cyclodextrin units.

According to the exemplary embodiment, the cyclodextrin unit of the polymer includes a unit derived from a compound represented by the following Chemical Formula 1.

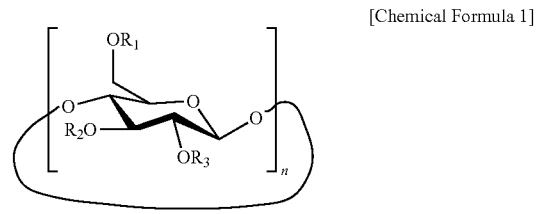

[Chemical Formula 1]

In Chemical Formula 1, $R_1$ to $R_3$ are the same as or different from each other and are each independently selected from the group consisting of hydrogen, a hydroxy group, an anionic group, a cationic group, a thiol group, and a $C_{1-20}$ alkyl group, n is an integer of 6 to 10, and substituent groups $R_1$ to $R_3$ of brackets [ ] are the same as or different from the substituent groups of other brackets. The substituent groups $R_1$ to $R_3$ may be selected in order to provide a deep hydrophobic cavity for bonding to the dye or high solubility, or in order to increase an ionic bonding ability and thus improve bonding to the dye.

In the exemplary embodiment of the present specification, the anionic group may be selected from the group consisting of a sulfone group, a carboxyl group, a phosphate group, and a halogen group.

In the exemplary embodiment of the present specification, the cationic group may be an amine group but is not limited thereto.

In the present specification, the term "unit derived from the compound" means a state in which the corresponding compound is polymerized to be bonded in the polymer, and thus, in a structure of the corresponding compound, all or a portion of two or more substituent groups may be eliminated and a radical for bonding in the polymer may be positioned at that position. The cyclodextrin unit may be bonded to an end of the polymer, or may be bonded to the middle of a main chain or a side chain of the polymer.

In the present specification, the term "polymer" means a compound formed by allowing two or more monomer compounds to be subjected to a polymerization reaction, and may include a concept of an oligomer, but a molecular weight thereof is not particularly limited. That is, in the present specification, the "polymer" is not limited as long as the polymer is a compound where the cyclodextrin unit is connected in any form.

In the case where cyclodextrin is the polymer, as compared to the case of one molecule of cyclodextrin, there is a merit in that in the case where a distance between the included dyes is maintained to increase a concentration of the dye in the film, shifting into a light emission region in a long wavelength band may be prevented.

Further, since cyclodextrin has a polymer form, a phenomenon that the dye is washed away by a solvent may be prevented.

In the present specification, inclusion means a state in which the dye is restricted in cyclodextrin due to hydrophobic interaction between dye molecules in a gap or an internal space formed by cyclodextrin molecules. The aforementioned inclusion may be configured in various forms, and may be determined according to whether a functional group of the cyclodextrin molecule and the dye is present or not, a kind thereof, a molecular size, or the like. FIG. 3 illustrates a schematic view of a lateral surface of an inclusion structure. Both sides represent the cyclodextrin molecules, and the middle represents the dye molecule.

It is preferable that a weight average molecular weight of the polymer be 2,000 to 20,000,000. This is a weight average molecular weight of only the cyclodextrin polymer with the exception of the molecular weight of the substituent group. According to the exemplary embodiment, the weight average molecular weight of the polymer is 2,000 to 500,000. The average molecular weight of the cyclodextrin polymer is not limited but is preferably 15,000 to 300,000.

There is no particular limit in a method of manufacturing the polymer, but a manufacturing method generally used in the present technical field may be used. For example, the manufacturing method may be a general method of manufacturing the polymer by using the dye and the cyclodextrin macromolecule.

Further, a mode of connecting the polymers to each other may be the same as a general connection mode of the polymers. For example, there is no particular limit, but the mode may be a mode where one or more of $R_1$ to $R_3$ in one unit body are bonded to $R_1$ to $R_3$ of another unit body or a mode where carbon constituting a cycle of one unit body and $R_1$ to $R_3$ or carbon of another unit body are bonded to each other.

In the present specification, the polymer may include two kinds or more different cyclodextrin units. The cyclodextrin units may be different from each other in terms of a size, that is, the number of glucose units or a functional group. In this case, the dye polymer may include two kinds or more different dyes. For example, in order to facilitate bonding according to a molecular structure of the dye, two kinds or more cyclodextrin units may be included, and the cyclodextrin unit may be used by combining cyclodextrin having a size where the dye molecule may be best bonded to the hydrophobic internal cavity of cyclodextrin.

According to the exemplary embodiment of the present specification, as the dye included in the cyclodextrin unit of the polymer, any dye may be used without a limit as long as the dye is known in the corresponding technical field. For example, as the dye, any dye may be used without a limit as long as a direct dye, an acidic dye, a basic dye, and a spray dye have a fluorescent property.

The range of the dye includes a dye that represents energy collected in the inside by limiting movement (vibration, translation, and the like) of the dye molecules as fluorescence, or represents fluorescence in a powder state by isolating the molecules when the dye forms a complex together with cyclodextrin in the case where even though the dye is dissolved in an appropriate solvent, fluorescence is not exhibited, or in the case where there is no fluorescence in the powder state. That is, in the case where the dye in the related art emits fluorescent light, if the present invention is applied, light emission efficiency is increased, and even though the dye in the related art does not emit fluorescent light, if the present invention is applied, dispersibility between the dye molecules becomes good, and thus there is a case where fluorescent light is emitted.

As the dye that is capable of forming the complex together with cyclodextrin, all dyes coinciding with an internal cavity property (hydrophobicity) of cyclodextrin to cause hydrophobic interaction are feasible, and the dye is not classified into cationic, anionic, and neutral dyes, but it is more preferable that the dye be the cationic dye. However, in the case where the cyclodextrin complex includes a cationic group, it is more preferable that the dye be the anionic dye.

In the case where the cyclodextrin unit is an ionic cyclodextrin unit, and specifically, the ionic group is the cationic group and the dye is the anionic dye, or in the case where the ionic group is the anionic group and the dye is the cationic dye, a bonding ability of cyclodextrin and the dye may be significantly increased. That is, stronger bonding is feasible through ion bonding between cyclodextrin and the dye as compared to the case where there is no ion bonding, and thus there is a merit in that light stability of the dye included in cyclodextrin is largely improved as compared to the dye not included in cyclodextrin.

As the dye that is capable of forming the ionic cyclodextrin complex, all dyes coinciding with the internal cavity property (hydrophobicity) of cyclodextrin to cause hydrophobic interaction are feasible, and the dye is not classified into the cationic, anionic, and neutral dyes. However, in consideration of the bonding ability of the anionic cyclodextrin unit with the hydrophobic internal cavity, it is preferable that the dye be the cationic dye, and in consideration of the bonding ability of the cationic cyclodextrin unit with the hydrophobic internal cavity, it is preferable that the dye be the anionic dye.

A specific example of the dye may include a dye absorbing light in a region ranging from a near ultraviolet ray to a visible ray to emit light having a wavelength that is different from that of absorbed light. For example, as the dye, a green light emission fluorescent dye having a maximum light emission wavelength of 500 nm or more and preferably 510 nm or more or a red light emission fluorescent dye having a maximum light emission wavelength of 600 nm or more and preferably 610 nm or more may be used, and specifically, the green light emission fluorescent dye having the maximum light emission wavelength of 500 to 550 nm or the red light emission fluorescent dye having the maximum light emission wavelength of 600 to 660 nm may be used. Specifically, as the dye, acrydine-based, xanthene-based, arylmethane-based, coumarin-based, polycyclic aromatic hydrocarbon-based, polycyclic heteroaromatic-based, perylene-based, pyrene-based, and pyrrole-based derivatives, and the like are preferable. Specific examples may include a Rhodamine-based pigment such as Rhodamine B, Rhodamine 6G, Rhodamine 3B, Rhodamine 101, Rhodamine 110, Sulfo Rhodamine, Basic violet 11, and Basic red 2, a pyridine-based pigment such as 1-ethyl-2-[4-(p-dimethylaminophenyl) 1,3-butadienyl]pyridinium-perchlorate, a cyanine-based pigment, an oxazine-based pigment, a coumarin-based pigment such as 3-(2'-benzothiazolyl)-7-diethylaminocoumarin (coumarin 6), 3-(2'-benzoimidazolyl)-7-N,N-diethyl aminocoumarin (coumarin 7), 3-(2'-N-methylbenzo imidazolyl)-7-N,N-diethylaminocoumarin (coumarin 30), and 2,3,5,6-1H,4H-tetrahydro-8-trifluoromethyl quinolizine (9,9a,1-gh) coumarin (coumarin 153), a naphthalimide-based pigment such as Basic Yellow 51 that is a coumarin pigment-based dye, Yellow 11 as an absorbent, and Yellow 116 as the absorbent, or the like. Selection of the dye is not particularly limited as long as the dye is a type coinciding with the internal cavity property (hydrophobicity) of cyclodextrin.

According to the exemplary embodiment of the present specification, in the dye complex, the content of the cyclodextrin unit may be preferably 100 to 5,000%, 500% to 3,000%, and for example, 1,000% based on the concentration of the fluorescent dye. A mole number ratio of the cyclodextrin unit and the dye molecule is determined according to the number of sites at which the dye may be bonded to cyclodextrin, but in order to actually form the complex, it is preferable that mixing be performed at a mole number ratio of at least 1:2 or more.

The aforementioned dye complex may be manufactured by mixing or agitating the dye and the aforementioned polymer. If necessary, after manufacturing, washing and/or pulverization processes may be performed.

In manufacturing the dye complex, a solvent may be used, and, for example, the dye complex may be manufactured by dissolving each material in water, DMF, DMSO, ethanol, methanol, or the like, and as the solvent, a mixture solvent obtained by mixing two kinds or more of the aforementioned solvents may be used.

Another exemplary embodiment of the present specification provides a light conversion film including the dye complex or a cured material thereof. Yet another exemplary embodiment of the present specification provides a light conversion film including a polymer including two or more cyclodextrin units or a cured material thereof, and a dye. The light conversion film may include the dye complex as it is, or may include a cured material obtained by curing the dye complex according to a kind of the polymer included in the dye complex, a further added binder resin, or other additives.

The film may further include, in addition to the dye complex, the binder resin or the cured material thereof, or the additive, if necessary. For example, the light conversion film may include the dye complex, and a cured material of a composition including a binder resin, if necessary, a polymerizable monomer, a polymerization initiator, and/or if necessary, a solvent. As the binder resin, a photo-curable resin, a thermosetting resin, a thermoplastic resin, and the like may be used. The binder resin is not particularly limited, but is preferably a water-soluble macromolecule and may be specifically polyvinyl alcohol. As the additive, one kind or more of various additives such as a light stabilizer, a curing agent, an IR absorbent, a UV absorbent, an antioxidant, a surfactant, an antistatic agent, a flame retardant, a lubricant, a heavy metal deactivator, hydrotalcite, organic carboxylic acid, a coloring agent, a processing aid, an inorganic additive, a filler, a transparentizing agent, a nucleating agent, and a crystallizing agent may be used.

The light conversion film including the dye complex or the cured material thereof may be formed of a film obtained from a resin solution where the dye complex is dissolved or dispersed in the binder resin, or the film may be contained in a form of the filler, an encapsulating agent, an attaching agent, or the like in a light conversion filter. A thickness of the light conversion film needs to be appropriately selected according to the purpose and the like, and is not particularly limited, but it is preferable that the thickness be selected in a range of 0.1 to 100 μm.

In order to exhibit a sufficient color conversion effect of the light conversion film, the thickness of the light conversion film is varied according to a kind of used binder resin, but for example, it is preferable to form the light conversion film having the thickness in the aforementioned preferable range by using a resin solution where a polymer including a dye complex or cyclodextrin and a dye are mixed at a ratio of 0.001 to 20 wt % in 100 wt % of a binder resin. Further, it is preferable that an amount of the dye complex used be determined such that absorbance at $\lambda_{max}$ of the light conversion film is 0.01 to 1.0.

A substrate may be provided on one surface of the light conversion film. As the substrate, substrates known in the corresponding technical field may be used while being not particularly limited. Subsequently, in consideration of a possibility that the substrate is not removed but included in a final product, it is preferable that the substrate have light transmittance, and for example, a glass, quartz, sapphire, or plastic substrate may be used.

According to the exemplary embodiment, the light conversion film may be manufactured by a method including step 1) preparing a composition including the dye complex and the binder resin; step 2) applying the composition on a substrate, and if necessary, drying the composition to form a film; and 3) curing the film formed on the substrate. If necessary, a step of applying the film in a pattern form in step 2) or a step of patterning the film during or after step 3) may be further performed.

In step 1), the composition may further include, if necessary, a polymerizable monomer, a polymerization initiator, and/or if necessary, a solvent. The composition may be prepared by mixing the dye complex and the binder resin, and if necessary, additional components. For example, the composition may be manufactured by dissolving or dispersing the components in the solvent.

In step 2), the composition may be uniformly applied in a thickness of 0.1 to 200 micrometers and specifically about 10 to 200 micrometers on the substrate, and an application thickness may be adjusted if necessary. For example, a method of forming a coat on a permanent support or a temporary support by allowing the composition to be subjected to a dip coating method, an air knife coating method, a curtain coating method, a roller coating method, a wire bar coating method, a gravure coating method, a spin coating method, or an extrusion coating method may be used.

In step 2), after the composition is applied on a base material, a drying process may be performed in order to remove a residual solvent. Drying may be performed, for example, by a method of drying the composition at 70 to 150° C. for at least 30 seconds. In the case where a drying temperature is 70° C. or more, the occurrence of stains or deformation of an application material may be prevented by sufficiently drying the composition. In the case where the drying temperature is 150° C. or less, even when the plastic substrate is used, deformation of the substrate may be prevented, and the occurrence of bubbles due to rapid vaporization of the solvent may be prevented.

In step 3), a method of the curing may be determined according to the polymer or the binder resin included in the dye complex, and for example, curing may be performed by irradiating ultraviolet rays. Irradiation of the ultraviolet rays may be performed under the atmosphere or under the nitrogen atmosphere in order to increase reaction efficiency, and for example, as a UV irradiating apparatus, an intermediate voltage or high voltage mercury UV lamp or a metal halide lamp having the intensity of 80 w/cm or more may be used.

As the binder resin, a thermosetting resin, a photo-curable resin, and a thermoplastic resin may be used, and it is preferable that a water-soluble macromolecule be used. Two kinds or more binder resins may be used together. Examples of the usable binder resin include a cellulose derivative such as methyl cellulose (MC), hydroxyethyl cellulose (HEC), carboxymethyl cellulose (CMC), and hydroxypropyl cellulose (HPC); cellulose ester such as polyethylene glycol (PEG), polyvinyl alcohol (PVA), polyacrylamide (PAAM), polyvinylpyrrolidone (PVP), polyacrylic acid, polystyrenesulfonic acid (PSSA), polysalicylic acid, polyphosphoric acid, polyethylenesulfonic acid, poly[3-(vinyloxy)propane-1-sulfonic acid, poly(4-vinylphenol), poly(4-vinylphenyl-sulfonic acid), polyethylenephosphoric acid, polymaleic acid, poly(2-methacryloyloxyethane-1-sulfonic acid), poly (3-methacryloyloxypropane-1-sulfonic acid), poly(4-vinylbenzoic acid), polyethyleneimine (PEI), polyamines, polyamideamine (PAMAM), polydiarylyldimethylammonium chloride (PDADMAC), poly(4-vinylbenzyltrimethylammonium salt), poly[(dimethylimino)trimethylene(dimethylimino)hexamethylene dibromide] (polybrene), poly(2-vinylpiperidine salt), poly(4-vinylpiperidine salt), poly(vinylamine salt), poly(2-vinylpyridine) and a normal-alkyl(quaternary) derivative, diacetyl cellulose, triacetyl cellulose (TAC), propionyl cellulose, butyryl cellulose, acetylpropionyl cellulose, and nitrocellulose; polyamide; polycarbonate; polyolefine such as polyester such as polyethylene terephthalate, polyethylene naphthalate, polybutylene terephthalate, poly-1,4-cyclohexanedimethylene terephthalate, polyethylene-1, 2-diphenoxyethane-4,4'-dicarboxylate, and polybutylene terephthalate, polystyrene, polyethylene, polypropylene, and polymethylpentene; an acryl resin such as polymethyl methacrylate; polycarbonate; polysulfone; polyethersulfone; polyetherketone; polyetherimide; polyoxyethylene; a norbornene resin; an ethylene-vinyl acetate copolymer (EVA), polyvinylbutyral (PVB), and the like, but are not limited thereto.

As the binder resin, as the water-soluble macromolecule, a cellulose derivative such as methyl cellulose (MC), hydroxyethyl cellulose (HEC), carboxymethyl cellulose (CMC), and hydroxypropyl cellulose (HPC); polyethylene glycol (PEG), polyvinyl alcohol (PVA), polyacrylamide (PAAM), polyvinylpyrrolidone (PVP), polyacrylic acid, polystyrenesulfonic acid (PSSA), polysalicylic acid, polyphosphoric acid, polyethylenesulfonic acid, poly[3-(vinyloxy)propane-1-sulfonic acid, poly(4-vinylphenol), poly(4-vinylphenylsulfonic acid), polyethylenephosphoric acid, polymaleic acid, poly(2-methacryloyloxyethane-1-sulfonic acid), poly(3-methacryloyloxypropane-1-sulfonic acid), poly(4-vinylbenzoic acid), polyethyleneimine (PEI), polyamines, polyamideamine (PAMAM), polydiarylyldimethylammonium chloride (PDADMAC), poly(4-vinylbenzyltrimethylammonium salt), poly[(dimethylimino)trimethylene(dimethylimino)hexamethylene dibromide] (polybrene), poly(2-vinylpiperidine salt), poly(4-vinylpiperidine salt), poly(vinylamine salt), poly(2-vinylpyridine) and a normal-alkyl(quaternary) derivative, and the like may be used.

The content of the binder resin is 0.1 to 20 wt % and preferably 0.1 to 10 wt % based on the total weight of the composition of the light conversion film. In the case where the content of the binder resin is 0.1 wt % or more, it is easy to control the thickness of the light conversion film, and in the case where the content is 20 wt % or less, an excessive increase in viscosity may be prevented to maintain uniformity of application and prevent light transmittance from being reduced.

As the polymerizable monomer, a compound having one or more ethylenically unsaturated groups may be used. The polymerizable monomer serves to induce a crosslinking reaction between the polymerizable monomer and the binder resin by the polymerizable monomer. As the polymerizable monomer, aldehydes, dialdehydes, isocyanates, and the like may be used, but the polymerizable monomer is not limited thereto. Examples of aldehydes or dialdehydes may include acrylaldehyde, oxalaldehyde, 2-methylacrylaldehyde, 2-oxopropanal, glutaraldehyde, and the like, but are not limited thereto. Examples of isocyanates may include 2-isocyanatoethyl 2-methylacrylate, 1,4-diisocyanatobutane, 1,4-diisocyanatobenzene, 1,3-diisocyanatobenzene, and the like, but are not limited thereto. The polymerizable monomer may be used alone or as a mixture of two kinds or more.

The content of the polymerizable monomer may be 0.01 to 2 wt % and preferably 0.01 to 1 wt % based on the total weight of the composition of the light conversion film. In the case where the content of the polymerizable monomer is 0.01 wt % or more, since a sufficient crosslinking reaction may be induced, durability may be prevented from being reduced, and in the case where the content is 2 wt % or less, a tendency to increase viscosity of the composition of the light conversion film as time passes is prevented, and thus the case is advantageous in views of solution stability and a uniform application property.

Alternatively, in the case where the present invention is used for the purpose requiring patterning entailing wet etching, the pattern may be manufactured by adding the dye complex according to the present invention to the composition formed of the aforementioned dye complex and a photo-curable or light-heat combination-type curable resin (resist). In this case, the cured material of the photo-curable or light-heat combination-type curable resin serves as a binder of the light conversion filter after patterning. Further, in order to smoothly perform patterning, it is preferable that the photo-curable or light-heat combination-type curable resin be soluble to an organic solvent or an alkali solution in a non-exposure state. Examples of the usable photo-curable or light-heat combination-type resin composition specifically include (1) a composition including an acryl-based multifunctional monomer having a plurality of acryloyl groups or methacryloyl groups and/or an oligomer, and a photo or thermal polymerization initiator, (2) a composition including polyvinyl ester cinnamate, a multifunctional monomer, and/or an oligomer, and a photo or thermal polymerization initiator, (3) a composition including chain-type or cycle-type olefine and bisazide (nitrene is generated and olefine is crosslinked), (4) a composition including a monomer having an epoxy group and an acid generator, and the like. Particularly, (1) the composition including the acryl-based multifunctional monomer and/or the oligomer, and the photo or thermal polymerization initiator is advantageous because a fixed chain can be patterned, and simultaneously, after curing by polymerization, reliability such as solvent resistance and heat resistance is high.

As the polymerization initiator, a photo-initiator or a thermo-initiator may be used according to a kind of the binder resin. Any photo-initiator may be used as long as the photo-initiator can induce a radical reaction, and in the case where a water-soluble macromolecule is used as the binder resin, it is more preferable that the photo-initiator be water-soluble. Examples of the photo-initiator may include IRGACURE 2959 (2-hydroxy-1-[4-(2-hydroxyethoxy)phenyl]-2-methyl-1-propanone), IRGACURE 500 (1-hydroxy-cyclohexyl-phenyl-ketone and benzophenone), and IRGACURE 754 (oxy-phenyl-acetic acid 2-[2 oxo-2 phenyl-acetoxy-ethoxy]-ethyl ester and oxy-phenyl-acetic 2-[2-hydroxy-ethoxy]-ethyl ester) provided by Ciba-Geigy Corp., and the like, but are not limited thereto.

The content of the photo-initiator is 0.01 to 5 wt % and preferably 0.01 to 2 wt % based on the total weight of the composition of the light conversion film. If the content of the photo-initiator is less than 0.01 wt %, it is difficult to expect a crosslinking reaction effect, and if the content is more than 5 wt %, transmittance is significantly reduced.

The solvent may be used while being not particularly limited as long as the solvent is not reacted with components of the composition but provides processability, and is preferably manufactured by being dissolved in water, alcohols, diols, ketones, esters, ethers, aliphatic or alicyclic hydrocarbons, aromatic hydrocarbons, hydrocarbon having a cyano group, halogenated aromatic hydrocarbons, and the like, and a mixture solvent thereof may be used.

Yet another exemplary embodiment of the present specification provides a light conversion film including a polymer including two or more cyclodextrin units, and a dye. Herein, one or more molecules of the dye are included in the cyclodextrin unit in the polymer. A description of the binder resin, the additive, or the manufacturing method described in the former exemplary embodiment may be applied to the light conversion film of the present exemplary embodiment.

For example, according to the aforementioned exemplary embodiments, a light conversion film converting light emitted from a LED chip having a single color into light of a white LED having high color purity and color reproducibility may be provided.

The thickness of the light conversion film according to the aforementioned exemplary embodiment may be selected according to a necessity, and for example, the thickness may be 0.1 to 50 micrometers.

According to the exemplary embodiment of the present specification, the light conversion film may be patterned. According to the exemplary embodiment, the light conversion film may be patterned to be used as a color filter.

According to the exemplary embodiment of the present specification, the light conversion film may be applied to a backlight unit. For example, the light conversion film may be provided on a front surface of an edge-type or direct-type light source. The edge-type light source includes a light emission means provided on a lateral surface, and a light guide plate diffusing light emitted from the light emission means.

The light conversion film may further include a protection layer or an insulating oxide layer if necessary. The protection layer may be included, or a light scattering film may be included. The light scattering film may scatter light when the light source passes through the film to allow the fluorescent dye to receive plenty of light.

The light conversion film may be used in a display or a lighting apparatus as will be described later, and also, in the case where a visible ray is converted into a near infrared ray region through light conversion, the light conversion film may be used as an energy collection film for a solar cell.

Still another exemplary embodiment of the present specification provides a light conversion device including the light conversion film.

The light conversion device may include two layers or more of the light conversion films. A plurality of light conversion films may convert light that is incident from the light source into lights having different wavelengths (color), and in this case, the light conversion device may, for example, convert light that is incident from a light emitting diode (LED) light source into white light to emit light.

FIG. 6 illustrates the light conversion device according to the exemplary embodiment of the present application, and the light conversion device includes a light extraction film, an adhesive (attaching) layer, a transparent substrate, and a light conversion film. The light conversion device according to FIG. 6 may be manufactured by applying a composition for a light conversion film including the aforementioned dye complex and binder resin and a composition including a polymerizable monomer and a polymerizable initiator on the transparent substrate, if necessary, curing or drying the compositions to manufacture the light conversion film, and forming the light extraction film and the adhesive layer on the light conversion film. FIG. 6 illustrates one layer of the light conversion film, but if necessary, two layers or more of the light conversion films may be laminated.

In the light conversion device according to FIG. 7, the light conversion film is a light conversion fluorescent diffusion film including one kind or more light diffusion particles. That is, the light conversion film included in FIG. 7 may include one kind or more organic fluorescent dyes, one kind or more light diffusion particles, and a macromolecule medium including one kind or more ionic macromolecules. The light diffusion particles serve to diffuse light that is incident from the light source in the light conversion film. Herein, the light diffusion particles may include titanium dioxide ($TiO_2$) or silica particles, and may include silica, zinc oxide, yttrium oxide, titanium dioxide, barium sulfate, alumina, molten silica, fumed silica, aluminum nitride, glass bead, zirconium dioxide, silicon carbide, silicon nitride, boron nitride, and the like, but are not limited thereto.

FIG. 8 illustrates the light conversion device according to the exemplary embodiment of the present application, and the light conversion device includes a light extraction film, an adhesive (attaching) layer, a transparent substrate, a light conversion film 1, and a light conversion film 2. The light conversion film 1 and the light conversion film 2 may include the same dye complex, or may include dye complexes that are not the same as each other. For example, in the case where the light conversion film 1 and the light conversion film 2 include the same dye complex, weights of the dye complexes included in the light conversion film 1 and the light conversion film 2 and weight ratios of the compositions for the light conversion film may be different from each other.

FIG. 9 is the light conversion device according to the exemplary embodiment of the present application, and the light conversion device may include a transparent substrate, a light conversion diffusion film 1, and a light conversion diffusion film 2. The light conversion diffusion films 1 and 2 may include the same dye complex, or may include dye complexes that are not the same as each other.

As illustrated in FIGS. 6 to 9, the light conversion device according to the exemplary embodiment of the present application does not include a barrier layer but includes the dye complex where interaction between the dye and ionic cyclodextrin is reinforced, and thus the light conversion film having improved light resistance can be manufactured.

FIG. 10 illustrates the light conversion device according to the exemplary embodiment of the present application, and barrier films including a transparent substrate and a barrier layer are provided on both sides of the light conversion film. In this case, the barrier layer of the barrier film is disposed to come into contact with the light conversion film.

Oxygen and moisture transmittances of the barrier layer may be each, for example, $10^{-1}$ $cc/m^2/day$ or less. This is mentioned as an example of the barrier film, and oxygen and moisture transmittances of the barrier layer may have a value that is different from the aforementioned value.

The barrier film may include the transparent substrate and the barrier layer formed on one surface of the transparent substrate. As the barrier layer, any matters known in the corresponding technical field may be used while being not particularly limited as long as the barrier layer is a layer blocking moisture or oxygen. For example, the barrier layer may include aluminum oxide or nitride and ionic metal oxide providing a moisture or oxygen blocking property. The barrier layer is a buffer layer, and may further include a buffer layer formed of one kind or more selected from sol-gel-based, acryl-based, epoxy-based, and urethane-based coating solution compositions. As an example, the barrier film may include an organic and inorganic hybrid coating layer, an inorganic layer, and a protection coating layer including inorganic nanoparticles subjected to surface reformation by organic silane on one surface or both surfaces of the base material. Herein, the inorganic layer may be formed of metal oxide or nitride. The inorganic nanoparticles may be nanoparticles of alumina, silica, zinc oxide, antimony oxide, titanium oxide, and zirconium oxide. The organic and inorganic hybrid coating layer may be formed by curing the coating composition including organic silane in a sol state by heat or UV, and the coating solution composition in the sol state may include, in some cases, an appropriate additive, solvent, or polymerization catalyst, or the like together with organic silane.

The light conversion device according to FIG. 10 may be formed by applying a composition for a light conversion film including the aforementioned dye complex and binder resin and a composition including a polymerizable monomer and a polymerizable initiator on the barrier film including the transparent substrate and the barrier layer, if necessary, curing or drying the compositions to manufacture the light conversion film, and laminating the barrier film including the transparent substrate and the barrier layer on the light conversion film. In this case, lamination of the light conversion film and the barrier film may be performed without any help of a separate adhesive or attaching agent. In the case where curing is performed after the composition is applied, a curing method and condition may be determined according to a kind of binder resin or other components. The transparent substrate may include a resin such as PET, but is not limited thereto, and a transparent plastic film or substrate known in the corresponding technical field may be used. FIG. 10 illustrates one layer of the light conversion film, but if necessary, two layers or more of the light conversion films may be laminated.

In the light conversion device according to FIG. 11, the light conversion film is a light conversion fluorescent diffusion film including one kind or more light diffusion particles. That is, the light conversion film included in FIG. 11 includes one kind or more organic fluorescent dyes, one kind or more light diffusion particles, and a macromolecule medium including one kind or more ionic macromolecules. In addition to this, the aforementioned description may be applied to the light diffusion particles, the barrier film including the transparent substrate and the barrier layer, the organic fluorescent dye, the macromolecule medium, and the like.

The light conversion device according to FIG. 12 further includes a light extraction plate. Specifically, in a structure where the barrier films including the transparent substrate and the barrier layer are laminated on both surfaces of the light conversion film, the adhesive layer or the attaching layer is provided on a surface that is opposite to a surface facing the light conversion film of any one barrier film, and the light extraction plate is attached thereto. The light extraction plate is configured to increase conversion efficiency of the light conversion film, and is not particularly limited as long as the light extraction plate is known in the corresponding technical field.

Meanwhile, FIG. 13 illustrates the structure of the light conversion device where a plurality of light conversion films is sequentially disposed. Specifically, the light conversion device includes a barrier film including the transparent substrate and a barrier layer formed on the transparent substrate; a first light conversion film applied on the barrier film; and a second light conversion film provided by the same method on the first light conversion film. The first light conversion film and the second light conversion film are the same as the aforementioned description of the light conversion film, and the first light conversion film and the second light conversion film may be formed of the same dye complex, or may be formed of different dye complexes. As illustrated in FIG. 13, the second light conversion film may be disposed to be directly laminated on the first light conversion film. However, the scope of the present invention is not limited to FIG. 13, and the first light conversion film and the second light conversion film may be disposed to be spaced apart from each other. In this case, another additional film may be provided between the first light conversion film and the second light conversion film. Further, FIG. 13 illustrates a structure including two light conversion films, but if necessary, three or more light conversion films may be laminated.

The light conversion device including a plurality of light conversion films like FIG. 13 may also further include a light extraction plate attached through the adhesive layer or the attaching layer like FIG. 12, and this structure is illustrated in FIG. 14. The light extraction plate extracts light that is incident from the light source and converted through the light conversion film to be emitted, and as described above, conversion efficiency of the light conversion film may be further increased by further including the light extraction plate.

The light extraction plate may have a scattering structure on a surface or in an inside thereof, or may include two kinds or more materials having different refractive indexes in the inside thereof in order to improve extraction efficiency of light. For example, the light extraction layer may be manufactured by applying a composition including scattering particles and a binder on a transparent substrate, and drying or curing the composition. If necessary, a planarization layer may be further provided on the coating layer including the scattering particles and the binder. As another example, the light extraction layer may be manufactured by forming an uneven structure on a transparent base material through micro-embossing. If necessary, a planarization layer may be further provided on the uneven structure.

According to the exemplary embodiment of the present specification, there is provided an electronic device including the light conversion film. The electronic device is not particularly limited as long as the electronic device requires the light conversion film. For example, the electronic device may be a lighting apparatus, a display apparatus, or a solar cell including the light conversion film, a color filter, or a backlight unit.

Hereinafter, the exemplary embodiments described in the present specification will be exemplified through Examples. However, the following Examples are set forth to illustrate the present invention, but the scope of the present invention is not limited thereto.

Example 1

25 ml of water, 1 mmol of fluorescein that was the xanthene-based green dye, and 9 mmol of the beta-cyclodextrin polymer (weight average molecular weight of 2,000 to 300,000 and cyclodextrin content of 60%) were put into the 100 ml flask, agitated at 50° C. for 72 hours, and slowly dried in the oven at 60° C. After drying, the obtained crystal mass was finely ground in the mortar, and sufficiently washed by ethanol to obtain the green dye-cyclodextrin polymer (macromolecule) complex in the powder state. The spectrum of the obtained complex is illustrated in FIG. 1.

Example 2

1 mmol of pyranine that was the pyrene-based green dye and 2 mmol of the beta-cyclodextrin macromolecule were put into 25 ml of water by the same method, agitated at room temperature for 72 hours, and slowly dried in the oven at 60° C. After drying, the obtained crystal mass was finely ground in the mortar, and sufficiently washed by ethanol to obtain the green dye-cyclodextrin polymer (macromolecule) complex in the powder state. The spectrum of the obtained complex is illustrated in FIG. 2.

The spectrum of FIG. 1 is a result obtained by measuring properties of the light conversion film manufactured by adding the green dye-cyclodextrin polymer (macromolecule) complex manufactured in Examples 1 and 2 in the concentration of 0.1 wt % to the PVA solution where 10 wt % of PVA is dissolved in the mixture solvent including water and ethanol at the mixing ratio of 5:5 based on the total weight of the solution, followed by agitation, applying the resulting solution having the aforementioned composition on the plastic base material so that the thickness is 10 μm after drying, and performing drying by hot wind in the drying oven at 100° C. for 10 minutes by the following method.

First, after the blue LED backlight unit, the light conversion film manufactured in the above, two prism sheets, and one DBEF polarizing plate for improving luminance were stacked to overlap each other, the change in spectrum before and after the light conversion film was applied was observed by using PR-705 spectrascan equipment. In FIG. 1, the red full line represents the result that blue backlight light is converted into the green color and the red color by the QD device in the case where the QD film for TV which is called QDEF manufactured by 3M Company was applied, and the black full line represents the result that when the film having the thickness of 10 μm manufactured by manufacturing the complex from the green fluorescent dyes which are called fluorescein and pyranine like Examples 1 and 2 by using the beta-cyclodextrin polymer (macromolecule), mixing the complex with 10 wt % of the PVA solution, and performing spin coating is applied, light conversion is feasible like the QD film.

Example 3

In order to confirm heat resistance of the light conversion film, the light conversion film manufactured by the same method as Example 2 was put into the constant-temperature oven at 85° C. completely blocked from external light, and the change in luminance was measured by using the aforementioned equipment at constant time intervals as possible, and the result is illustrated in FIG. 3.

Comparative Example 1

For comparison with Example 3, the light conversion film manufactured by the aforementioned method and using only pyranine was put into the constant-temperature oven at 85° C. completely blocked from external light, and the change in luminance was measured by the aforementioned method at constant time intervals as possible, and the result is illustrated in FIG. 3.

Example 4

1 mmol of pyranine that was the pyrene-based green fluorescent dye and 2 mmol of the sulfate beta-cyclodextrin polymer were added to 10 ml of water, agitated at room temperature for 72 hours, and slowly dried in the oven at 70° C. After drying, the obtained crystal mass was finely ground in the mortar, and sufficiently washed by ethanol to complete the pyranine-cyclodextrin polymer complex in the powder state. The light conversion film manufactured by adding the manufactured pyranine-cyclodextrin polymer complex in the concentration of 0.1% based on the weight of PVA to the PVA solution where 10% PVA was dissolved in water based on the total weight of the solution, followed by agitation, applying the resulting solution having the aforementioned composition on the plastic base material so that the thickness was 10 μm after drying, and performing drying by hot wind in the drying oven at 100° C. for 10 minutes was put on the blue LED backlight installed in the oven at 60° C., and the change in brightness with time was observed by using PR-705 spectrascan equipment, and the result is illustrated in FIG. 4.

Example 5

10 ml of DMF, 1 mmol of bodipy that was the epirol-based green fluorescent dye, and 3 mmol of each of the methylcyclodextrin polymer, the hydroxypropylcyclodextrin polymer, and the triacetylcyclodextrin polymer were added, agitated at room temperature for 72 hours, and slowly dried in the oven at 70° C. After drying, the obtained crystal mass was finely ground in the mortar, and sufficiently washed by distilled water, and the solution obtained by washing was slowly dried again in the oven at 70° C. to complete the bodipy-cyclodextrin polymer complex in the powder state. The light conversion film manufactured by adding the manufactured bodipy-cyclodextrin polymer complex in the concentration of 0.1% based on the weight of SAN to the SAN solution where 30% SAN (styrene-acrylonitrile) was dissolved in DMF based on the total weight of the solution, followed by agitation, applying the resulting solution having the aforementioned composition on the plastic base material so that the thickness was 10 μm after drying, and performing drying by hot wind in the drying oven at 100° C. for 10 minutes was put on the blue LED backlight installed in the oven at 60° C., and the change in brightness with time was observed by using PR-705 spectrascan equipment, and the result is illustrated in FIG. 5.

Comparative Example 2

The light conversion film manufactured by adding pyranine in the concentration of 0.1% based on the weight of PVA to the PVA solution where 10% PVA was dissolved in water based on the total weight of the solution, followed by agitation, applying the resulting solution having the aforementioned composition on the plastic base material so that the thickness was 10 μm after drying, and performing drying by hot wind in the drying oven at 100° C. for 10 minutes was put on the blue LED backlight installed in the oven at 60° C., and the change in brightness with time was observed by using PR-705 spectrascan equipment, and the result is illustrated in FIG. 4.

Comparative Example 3

The light conversion film manufactured by adding the manufactured bodipy-cyclodextrin polymer complex in the concentration of 0.1% based on the weight of SAN to the SAN solution where 30% SAN (styrene-acrylonitrile) was dissolved in DMF based on the total weight of the solution, followed by agitation, applying the resulting solution having the aforementioned composition on the plastic base material so that the thickness was 10 μm after drying, and performing drying by hot wind in the drying oven at 100° C. for 10 minutes was put on the blue LED backlight installed in the oven at 60° C., and the change in brightness with time was observed by using PR-705 spectrascan equipment, and the result is illustrated in FIG. 5.

Referring to FIGS. 4 and 5, in the case of the light conversion film including the dye-cyclodextrin macromolecule complex of the present invention, it can be confirmed that a light resistance property is largely improved. In the case of bare bodipy that was not subjected to cyclodextrin treatment of FIG. 5, the luminance value after 220 hours elapsed under the light resistance test condition was reduced by 50% as compared to the initial value, but in the case where cyclodextrin was included, the luminance value was reduced by 5% as compared to the initial value, and thus it can be seen that light resistance stability is excellent.

The invention claimed is:

1. A dye complex comprising:
a polymer including two or more cyclodextrin units;
a dye included in an internal cavity of the cyclodextrin unit of the polymer;
wherein a weight average molecular weight of the polymer is 2000 to 20,000,000; and
wherein the dye is selected from the group consisting of acrydines, xanthenes, arylmethanes, perylenes, pyrenes, pyrroles, and polycyclic heteroaromatics, wherein the dye is not cyclodextrin; and
wherein the content of the cyclodextrin unit is 100 to 5,000% based on the concentration of the dye.

2. The dye complex of claim 1, wherein the cyclodextrin unit is a unit derived from a compound represented by the following Chemical Formula 1:

[Chemical Formula 1]

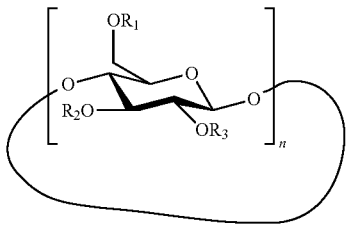

in Chemical Formula 1,
$R_1$ to $R_3$ are the same as or different from each other and are each independently selected from the group consisting of hydrogen, a hydroxy group, a cationic group, an anionic group, a thiol group, and a $C_{1-20}$ alkyl group, n is an integer of 6 to 10, and substituent groups $R_1$ to $R_3$ of brackets are the same as or different from the substituent groups of other brackets.

3. The dye complex of claim 2, wherein the anionic group is selected from the group consisting of a sulfone group, a carboxyl group, a phosphate group, and a halogen group.

4. The dye complex of claim 2, wherein the anionic group is an amine group.

5. The dye complex of claim 1, wherein 2 or more and 1,000 or less cyclodextrin units exist.

6. The dye complex of claim 1, wherein the polymer includes two kinds or more different cyclodextrin units.

7. The dye complex of claim 1, wherein the dye includes two kinds or more different dyes.

8. The dye complex of claim 1, wherein a mole number ratio of the cyclodextrin unit and the dye is 1:2 or more.

9. A light conversion film comprising:
the dye complex according to claim 1 or a cured material thereof.

10. The light conversion film of claim 9, wherein the light conversion film includes a cured material of a composition including a binder resin, a polymerizable monomer, and a polymerization initiator.

11. The light conversion film of claim 9, wherein the light conversion film includes a substrate provided on one surface of the light conversion film.

12. A light conversion film comprising:
a polymer including two or more cyclodextrin units or a cured material thereof; and
the dye complex according to claim 1.

13. The light conversion film of claim 12, wherein the light conversion film includes a cured material of a composition including a binder resin, a polymerizable monomer, and a polymerization initiator.

14. The light conversion film of claim 12, wherein the light conversion film includes a substrate provided on one surface of the light conversion film.

15. A color filter comprising:
the light conversion film according to claim 9.

16. An electronic device comprising:
the light conversion film according to claim 9.

17. A color filter comprising:
the light conversion film according to claim 12.

18. An electronic device comprising:
the light conversion film according to claim 12.

* * * * *